(12) United States Patent
Ueno et al.

(10) Patent No.: US 8,507,296 B2
(45) Date of Patent: Aug. 13, 2013

(54) SUBSTRATE PROCESSING METHOD AND FILM FORMING METHOD

(75) Inventors: Masaaki Ueno, Toyama (JP); Masakazu Shimada, Toyama (JP); Takeo Hanashima, Toyama (JP); Haruo Morikawa, Toyama (JP); Akira Hayashida, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 927 days.

(21) Appl. No.: 12/382,343

(22) Filed: Mar. 13, 2009

(65) Prior Publication Data

US 2009/0197352 A1 Aug. 6, 2009

Related U.S. Application Data

(62) Division of application No. 12/087,479, filed as application No. PCT/JP2007/053151 on Feb. 21, 2007.

(30) Foreign Application Priority Data

Mar. 7, 2006 (JP) ................................. 2006-061318

(51) Int. Cl.
*H01L 21/00* (2006.01)
*B05C 11/02* (2006.01)
*G06F 19/00* (2011.01)

(52) U.S. Cl.
USPC ............... 438/5; 438/795; 118/666; 700/153

(58) Field of Classification Search
USPC ....................... 438/5, 795; 700/153; 118/666
See application file for complete search history.

(56) References Cited

U.S. PATENT DOCUMENTS

| 5,607,009 | A  | * | 3/1997 | Turner et al. ................. 165/48.1 |
| 6,783,630 | B2 | * | 8/2004 | Shajii et al. ............... 156/345.53 |
| 6,787,377 | B2 | * | 9/2004 | Wang et al. ..................... 438/14 |
| 7,972,444 | B2 | * | 7/2011 | Zucker et al. ................. 118/728 |

(Continued)

FOREIGN PATENT DOCUMENTS

| EP | 1 187 188 A1 | 3/2002 |
| JP | A-09-092624 | 4/1997 |

(Continued)

OTHER PUBLICATIONS

Aug. 24, 2012 Office Action issued in U.S. Appl. No. 12/087,479.

(Continued)

*Primary Examiner* — William D Coleman
(74) *Attorney, Agent, or Firm* — Oliff & Berridge, PLC

(57) ABSTRACT

A substrate processing method in a processing chamber, has: accommodating a substrate into a processing chamber; and processing the substrate in the processing chamber on the basis of a correlation of a preset temperature of a heating device, a flow rate of fluid supplied by a cooling device and a temperature deviation between the center side of the substrate accommodated in the processing chamber and the outer peripheral side of the substrate while the substrate accommodated in the processing chamber is optically heated from an outer periphery side of the substrate at a corrected preset temperature by the heating device and the fluid is supplied to the outside of the processing chamber at the flow rate based on the correlation concerned to cool the outer peripheral side of the substrate by the cooling device.

16 Claims, 12 Drawing Sheets

(56) References Cited

U.S. PATENT DOCUMENTS

| | | |
|---|---|---|
| 2002/0127828 A1 | 9/2002 | Suzuki et al. |
| 2003/0049372 A1* | 3/2003 | Cook et al. ................ 427/248.1 |
| 2004/0238649 A1 | 12/2004 | Ohminami |
| 2005/0072716 A1* | 4/2005 | Quiles et al. .................. 206/710 |
| 2005/0183820 A1* | 8/2005 | Fukuda et al. ........... 156/345.27 |
| 2007/0084406 A1* | 4/2007 | Yudovsky et al. ............. 118/724 |
| 2009/0029486 A1* | 1/2009 | Ueno et al. ........................ 438/5 |

FOREIGN PATENT DOCUMENTS

| | | |
|---|---|---|
| JP | A-2001-308085 | 11/2001 |
| JP | A-2002-231716 | 8/2002 |
| JP | A-2003-031506 | 1/2003 |
| JP | A-2003-031510 | 1/2003 |
| JP | A-2005-032883 | 2/2005 |
| WO | WO 01/61736 A1 | 8/2001 |
| WO | WO 2005/008755 A1 | 1/2005 |

OTHER PUBLICATIONS

Apr. 6, 2012 Office Action issued in Japanese Application No. 2009-067667 (with translation).

Apr. 6, 2012 Office Action issued in Japanese Application No. 2008-505019 (with translation).

Apr. 15, 2013 Office Action issued in U.S. Appl. No. 12/087,479.

* cited by examiner

SEMICONDUCTOR PROCESSING APPARATUS 1

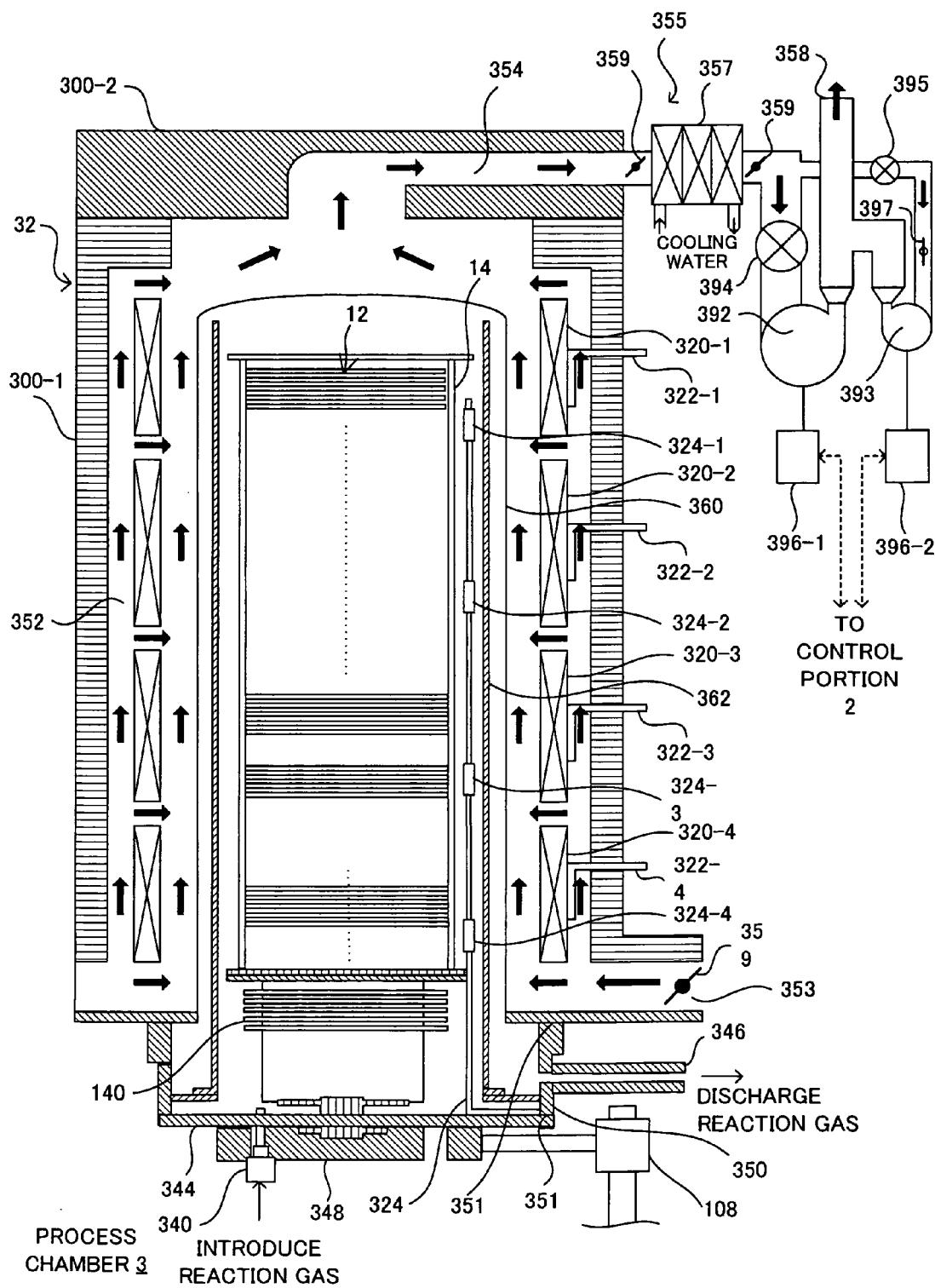

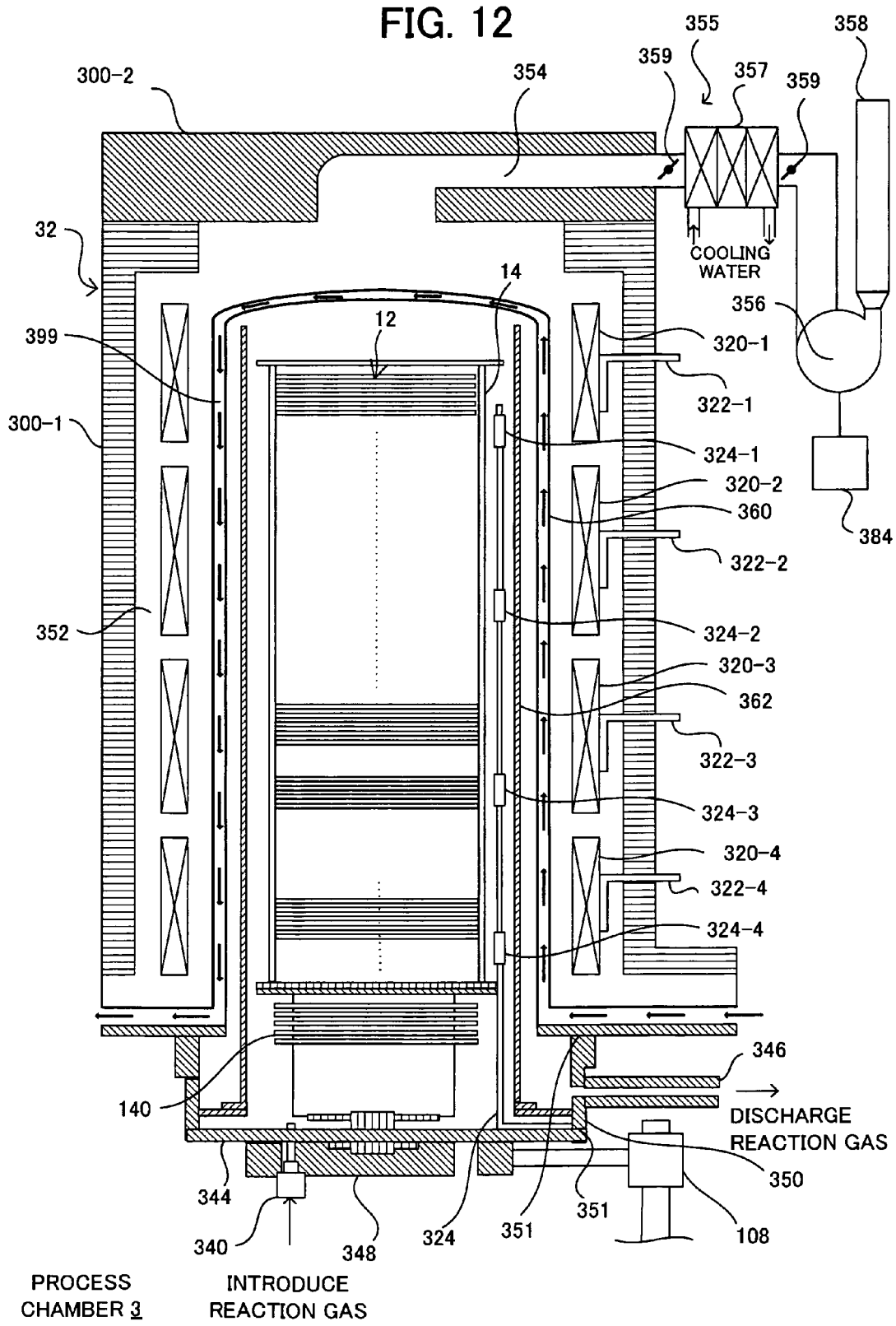

SUBSTRATE PROCESSING METHOD AND FILM FORMING METHOD

TECHNICAL FIELD

The present invention relates to a substrate processing method and a film forming method.

BACKGROUND ART

For example, Patent Document 1 discloses a substrate processing apparatus that makes the thickness of a film deposited on the substrate uniform by controlling a heating temperature of the substrate by finding a variance temperature amount N to achieve a desired average temperature deviation M using a deviation between the temperature at the end portion and the temperature at the center portion of the substrate generated when the heating temperature of the substrate is varied within a predetermined time and a steady-state deviation between the temperature at the end portion and the temperature at the center portion of the substrate.

However, even when the desired average temperature deviation M is achieved, there is a limit of uniformity for the thickness of a film deposited on the substrate.

Patent Document 1: WO 2005/008755

DISCLOSURE OF THE INVENTION

Problems that the Invention is to Solve

An object of the invention is to provide a substrate processing method and a film forming method capable of controlling uniformity of the thickness of a film deposited on the substrate.

Means for Solving the Problems

In order to achieve the above and other objects, a substrate processing method in a processing chamber has accommodating a substrate into a processing chamber; and processing the substrate in the processing chamber on the basis of a correlation of a preset temperature of a heating device, a flow rate of fluid supplied by a cooling device and a temperature deviation between the center side of the substrate accommodated in the processing chamber and the outer peripheral side of the substrate while the substrate accommodated in the processing chamber is optically heated from an outer periphery side of the substrate at a corrected preset temperature by the heating device and the fluid is supplied to the outside of the processing chamber at the flow rate based on the correlation concerned to cool the outer peripheral side of the substrate by the cooling device.

BRIEF DESCRIPTION OF THE DRAWINGS

FIG. 8 show graphs representing examples of a relation between the temperature and the film thickness set when the semiconductor processing apparatus deposits a film on the substrate, such as a wafer.

FIG. 9 show graphs representing comparative examples of a relation between the temperature and the film thickness set when the semiconductor processing apparatus deposits a film on the substrate, such as a wafer.

FIG. 10 is a view showing a first modification of the process chamber.

FIG. 12 is a view showing a third modification of the process chamber.

DESCRIPTION OF REFERENCE NUMERALS AND SIGNS

Figure 1:
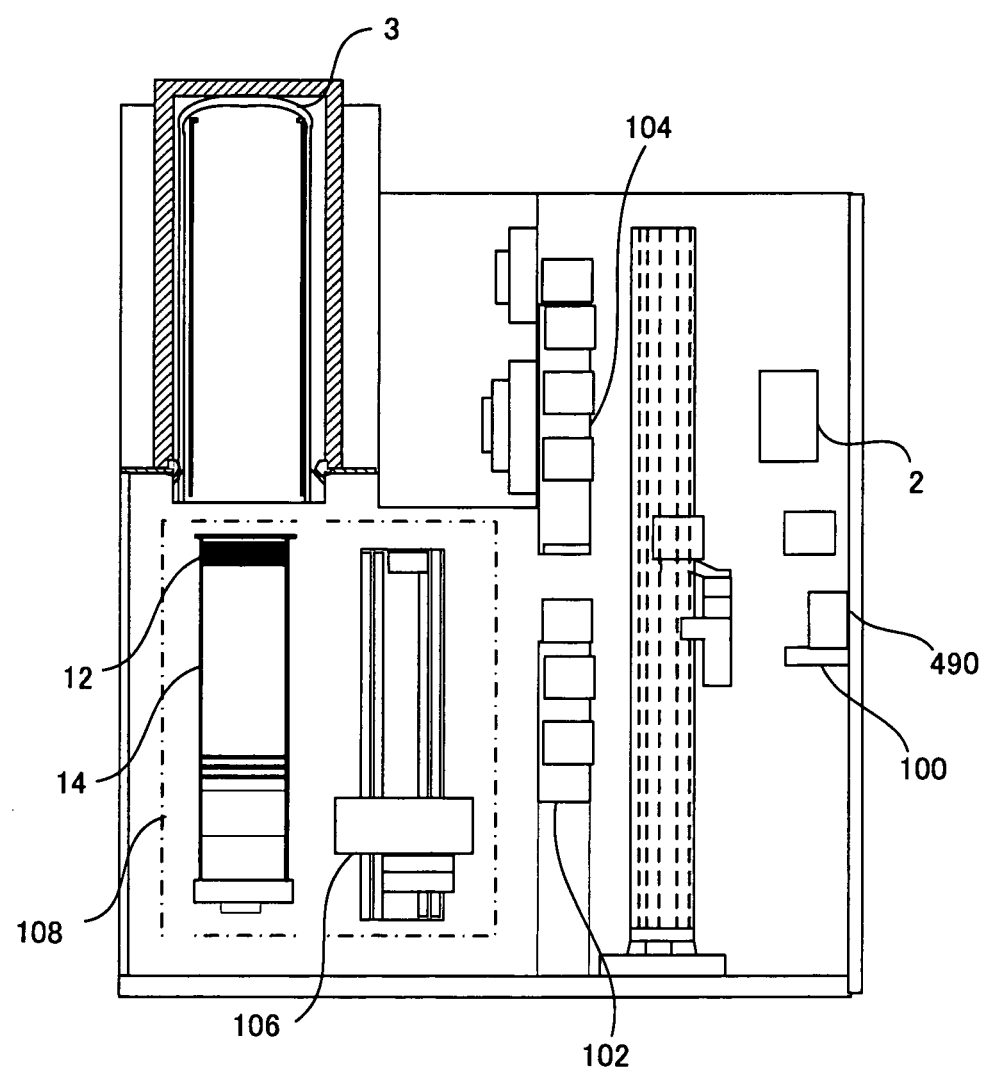
FIG. 1 is view showing the overall configuration of a semiconductor processing apparatus to which the invention is applicable.

1 . . . semiconductor processing apparatus
  12 . . . wafer
  14 . . . boat
  100 . . . cassette exchanging unit
  102 . . . cassette stocker
  106 . . . wafer moving machine
  108 . . . boat elevator
  490 . . . wafer cassette
2 . . . control portion
  22 . . . display and input portion
  200 . . . CPU
  204 . . . memory
  24 . . . recording portion
  240 . . . recording medium
  40 . . . control program
    400 . . . process control portion
    410 . . . temperature control portion
    412 . . . process gas flow rate control portion
    414 . . . driving control portion
    416 . . . pressure control portion
    418 . . . process gas exhaust device control portion
    420 . . . temperature measurement portion
    422 . . . cooling gas flow rate control portion
    424 . . . temperature preset value storage portion
    442 . . . temperature setting correction value storage portion
3 . . . process chamber
  300 . . . heat insulating material
  32 . . . heater
    320 . . . temperature regulation part
    322 and 324 . . . temperature sensor
    340 . . . gas introducing nozzle 344 . . . throat lid
346 . . . exhaust tube
348 . . . rotation shaft
350 . . . manifold
351 . . . O-ring
352 . . . cooling gas channel
353 . . . air inlet hole
354 . . . exhaust channel
355 . . . exhaust portion
356 . . . cooling gas exhaust device
357 . . . radiator
358 . . . exhaust hole
359 . . . shutter
360 . . . outer tube
362 . . . inner tube
370 . . . temperature control device
372 . . . temperature measurement device
374 . . . MFC
376 . . . EC
378 . . . PS
380 . . . APC
382 . . . EP
390 . . . L-type temperature sensor
392 and 393 . . . cooling gas exhaust device
394 and 395 . . . shutter
396-1 and 396-2 . . . inverter
397 . . . dumper
398 . . . tube
399 . . . cooling gas channel Best Mode for Carrying out the Invention
Background of the Invention In order to facilitate the understanding of the invention, the background as to how the invention was achieved will be described prior to the description of embodiments.

Semiconductor Processing Apparatus 1

FIG. 1 is a view showing the overall configuration of a semiconductor processing apparatus 1 to which the invention is applicable.

Figure 2:
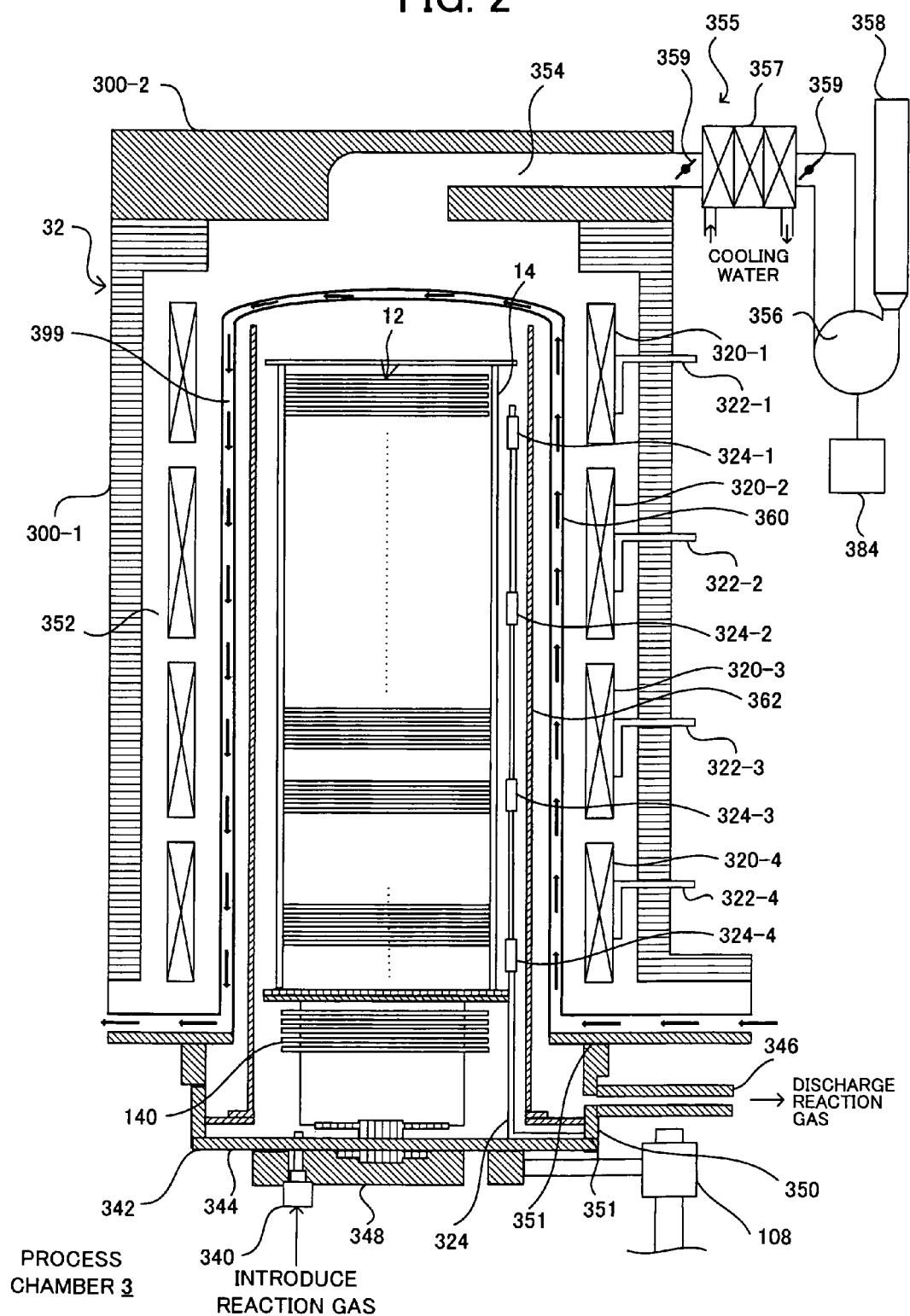
FIG. 2 is a view showing a process chamber in a state where a boat and wafers shown in FIG. 1 are accommodated therein by way of example.

FIG. 2 is a view showing a process chamber 3 in a state where a boat 14 and wafers 12 shown in FIG. 1 are accommodated therein by way of example.

Figure 3:
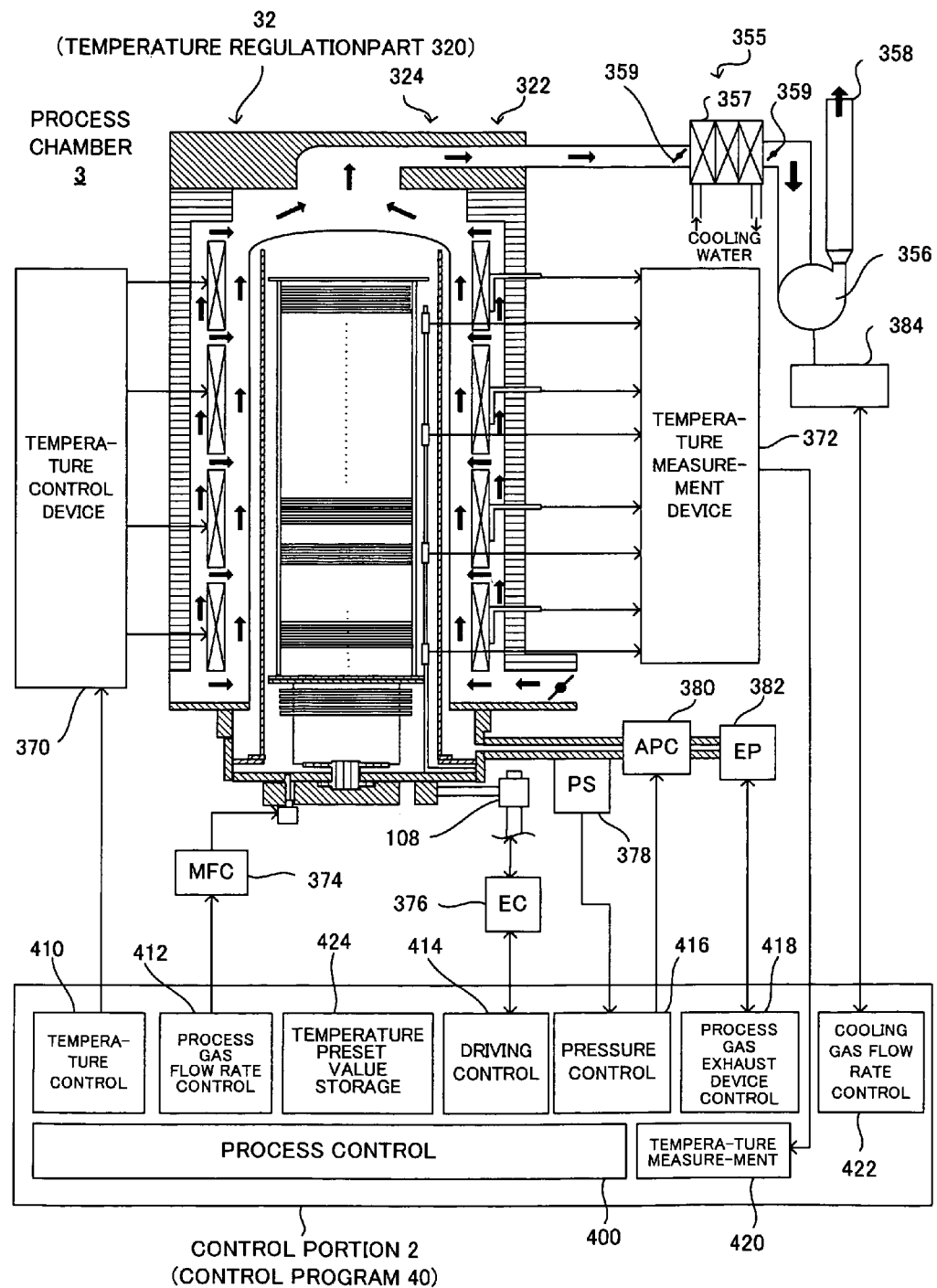
FIG. 3 is a view showing the components on the periphery of the process chamber shown in FIGS. 1 and 2 and the configuration of a first control program to control the process chamber.

FIG. 3 is a view showing components on the periphery of the process chamber 3 shown in FIG. 1 and FIG. 2 and the configuration of a first control program 40 to control the process chamber 3.

The semiconductor processing apparatus 1 is a so-called low-pressure CVD apparatus that processes a substrate, for example, a semiconductor.

As is shown in FIG. 1, the semiconductor processing apparatus 1 is formed of a cassette exchanging unit 100, a cassette stocker 102 provided on the rear side of the cassette exchanging unit 100, a buffer cassette stocker 104 provided above the cassette stocker 102, a wafer moving machine 106 provided on the rear side of the cassette stocker 102, a boat elevator 108 provided on the rear side of the wafer moving machine 106 for transporting a boat 14 in which wafers 12 are set, a process chamber 3 provided above the wafer moving machine 106, and a control portion 2.

Process Chamber 3

As is shown in FIG. 2, the process chamber 3 shown in FIG. 1 is formed of a hollow heater 32, an outer tube 360, an inner tube 362, a gas introducing nozzle 340, a throat lid 344, an exhaust tube 346, a rotation shaft 348, a manifold 350 made, for example, of stainless, O-rings 351, a cooling gas channel 352, an exhaust channel 354, an exhaust portion 355, and other components (descried below with reference to FIG. 3), such as a process gas flow rate control device. It is covered with a heat insulating material 300-1 from the side and covered with a heat insulating material 300-2 from above.

Also, plural heat insulating plates 140 are provided at the bottom portion of the boat 14.

The outer tube 360 is made, for example, of quartz that transmits light, and is formed in a cylindrical shape having an opening at the bottom portion.

The inner tube 362 is made, for example, of quartz that transmits light, and is formed in a cylindrical shape. It is provided concentrically with the outer tube 360 on the inner side thereof.

A cylindrical space is therefore defined between the outer tube 360 and the inner tube 362.

The heater 32 includes outside temperature sensors 322-1 through 322-4, such as thermocouples, provided between four temperature regulation parts (U, CU, CL, and L) 320-1 through 320-4 each capable of setting and regulating the temperature thereof and the heat insulating material 300-1 and inside temperature sensors (in-core TCs) 324-1 through 324-4, such as thermocouples, provided inside the outer tube 360 so as to correspond to the temperature regulation parts 320-1 through 320-4, respectively.

The inside temperature sensors 324-1 through 324-4 may be provided on the inner side of the inner tube 362 or they may be provided between the inner tube 362 and the outer tube 360. Alternatively, they may be bent for the respective temperature regulation parts 320-1 through 320-4 and provided to detect the temperature at the wafer center portion between a wafer 12 and another wafer 12.

Each of the temperature regulation parts 320-1 through 320-4 of the heater 32 emits, for example, light to optically heat the wafers 12 from the periphery of the outer tube 360 and raises the temperature (heats) of the wafers 12 by light that passes through the outer tube 360 and is then absorbed into the wafers 12.

The cooling gas channel 352 is defined between the heat insulating material 300-1 and the outer tube 360 for letting a fluid, such as a cooling gas, pass through, and it forces a cooling gas supplied from an air inlet hole 353 provided at the lower end portion of the heat insulating material 300-1 to pass through toward the upper side of the outer tube 360.

The cooling gas is, for example, air or nitrogen ($N_2$).

The cooling gas channel 352 is configured in such a manner that the cooling gas spouts out toward the outer tube 360 from the respective spaces among the temperature regulation parts 320-1 through 320-4.

The cooling gas cools the outer tube 360 and the cooled outer tube 360 in turn cools the wafers 12 set in the boat 14 from the circumferential direction (the outer periphery side).

In other words, it is configured in such a manner that the outer tube 360 and the wafers 12 set in the boat 14 are cooled from the circumferential direction (the outer periphery side) by the cooling gas that passes through the cooling gas channel 352.

The exhaust channel 354 is provided above the cooling gas channel 352. The exhaust channel 354 introduces the cooling gas that was supplied from the air inlet hole 353 and passed through the cooling gas channel 352 upward to the outside of the heat insulating material 300-2.

Also, the exhaust channel 354 is provided with the exhaust portion 355 that exhausts the cooling gas.

The exhaust portion 355 has a cooling gas exhaust device 356, such as a blower, and a radiator 357, and exhausts the cooling gas introduced to the outside of the heat insulating material 300-2 via the exhaust channel 354 through an exhaust opening 358.

The radiator 357 cools the cooling gas whose temperature has risen while it cools the outer tube 360 and the wafers 12 inside the process chamber 3 using cooling water or the like.

A shutter 359 is provided in the vicinity of each of the air inlet hole 353 and the radiator 357, and opening and closing of the cooling gas channel 352 and the exhaust channel 354 are controlled by an unillustrated shutter control portion.

Also, as is shown in FIG. 3, the process chamber 3 is additionally provided with a temperature control device 370, a temperature measurement device 372, a process gas flow rate control device (a mass flow controller, abbreviated as MFC) 374, a boat elevator control device (an elevator controller, abbreviated as EC) 376, a pressure sensor (PS) 378, a pressure regulation device (an auto pressure control (valve), abbreviated as APC) 380, a process gas exhaust device (EP) 382, and an inverter 384.

The temperature control device 370 drives the respective temperature regulation parts 320-1 through 320-4 under the control of the control portion 2.

The temperature measurement device 372 detects the temperatures of the respective temperature sensors 322-1 through 322-4 and 324-1 through 324-4, and outputs them to the control portion 2 as temperature measurement values.

The boat elevator control device (EC) 376 drives the boat elevator 108 under the control of the control portion 2.

As the pressure regulation device (hereinafter, referred to as APC) 380, for example, an APC or an N2 ballast controller is used.

Also, as the EP 382, for example, a vacuum pump is used.

The inverter 384 controls the number of revolutions of the cooling gas exhaust device 356 as a blower.

Control Portion 2

Figure 4:
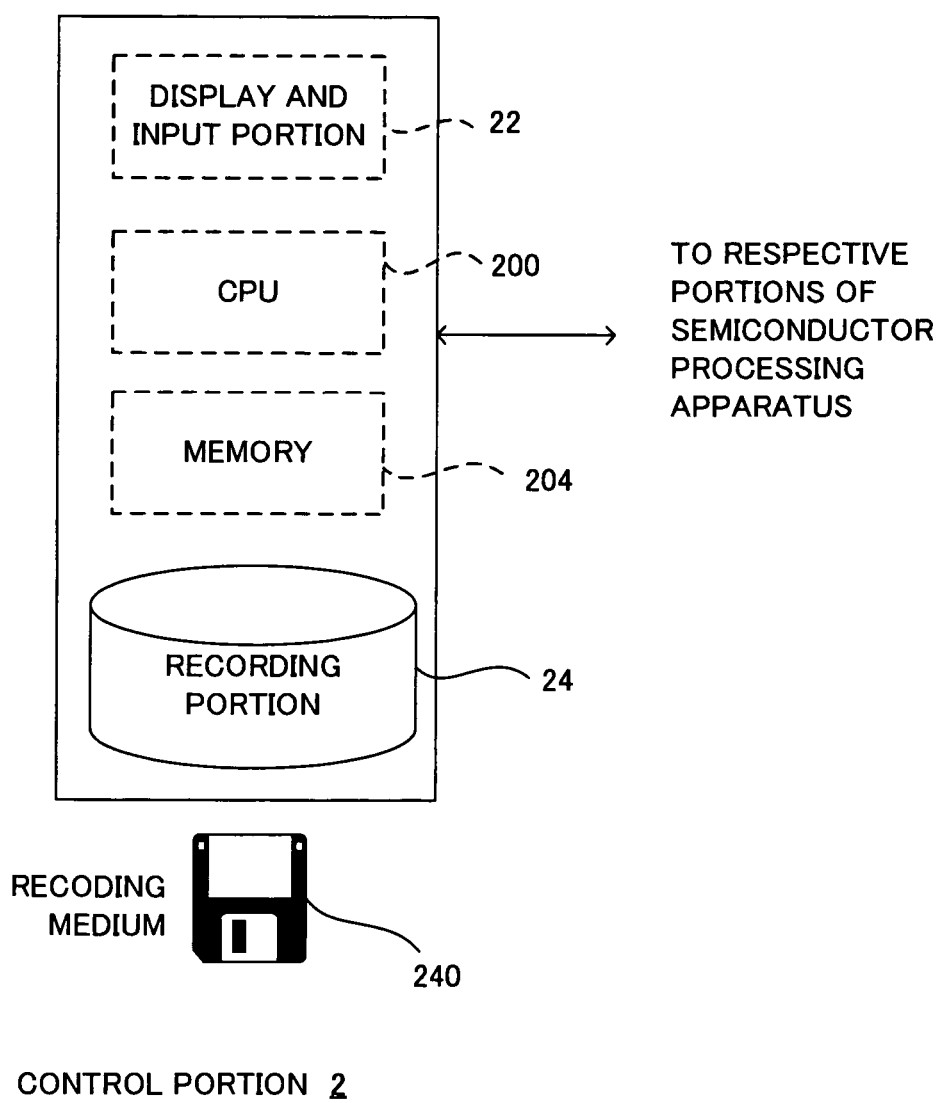
FIG. 4 is a view showing the configuration of a control portion shown in FIG. 1.

FIG. 4 is a view showing the configuration of the control portion 2 shown in FIG. 1.

As is shown in FIG. 4, the control portion 2 is formed of a CPU 200, a memory 204, a display and input portion 22 including a display device, a touch panel, a keyboard, a mouse, and the like, and a recording portion 24, such as an HD and a CD.

In short, the control portion 2 includes components as a typical computer capable of controlling the semiconductor processing apparatus 1.

The control portion 2 controls the respective components of the semiconductor processing apparatus 1 by running a control program for low-pressure CVD processing (for example, the control program 40 shown in FIG. 3) using the foregoing components, so that the low-pressure CVD processing described below is applied to the semiconductor wafers 12.

First Control Program 40

A reference will be made again to FIG. 3.

As is shown in FIG. 3, the control program 40 is formed of a process control portion 400, a temperature control portion 410, a process gas flow rate control portion 412, a driving control portion 414, a pressure control portion 416, a process gas exhaust device control portion 418, a temperature measurement portion 420, a cooling gas flow rate control portion 422, and a temperature preset value storage portion 424.

The control program 40 is supplied to the control portion 2, for example, via a recording medium 240 (FIG. 4) and run after it is loaded into a memory 204.

The temperature preset value storage portion 424 stores a temperature preset value in a process recipe for the wafers 12 and outputs it to the process control portion 400.

The process control portion 400 controls the respective components of the control program 40 according to operations of the user on the display and input portion 22 of the control portion 2 (FIG. 4) or the procedure (process recipe) of the processing recorded in the recording portion 24, and applies the low-pressure CVD processing to the wafers 12 as will be described below.

The temperature measurement portion 420 accepts the temperature measurement values of the temperature sensors 322 and 324 via the temperature measurement device 372 and outputs them to the process control portion 400.

The temperature control section 410 receives the temperature preset value and the temperature measurement values of the temperature sensors 322 and 324 from the process control portion 400, and performs feedback control on electric power to be supplied to the temperature regulation parts 320 so as to heat the interior of the outer tube 360 for the wafers 12 to achieve a desired temperature.

The process gas flow rate control portion 412 controls the MFC 374 and regulates a flow rate of a process gas or an inert gas to be supplied inside the outer tube 360.

The driving control portion 414 controls the boat elevator 108 to move up or down the boat 14 and the wafers 12 held therein.

Also, the driving control portion 414 controls the boat elevator 108 to rotate the boat 14 and the wafers 12 held therein via the rotation shaft 348.

The pressure control portion 416 receives the pressure measurement value of the process gas inside the outer tube 360 from the PS 378 and controls the APC 380 for the process gas inside the outer tube 360 to be at a desired pressure.

The process gas exhaust device control portion 418 controls the EP 382 to exhaust a process gas or an inert gas inside the outer tube 360.

The cooling gas flow rate control portion 422 controls the flow rate of the cooling gas exhausted by the cooling gas exhaust device 356 via the inverter 384.

In the description below, in a case where components provided in a plural form, such as the temperature regulation parts 320-1 through 320-4, are occasionally referred to simply as the temperature regulation parts 320 without specifying which one is which.

Also, in the description below, the number of the components, such as the temperature regulation parts 320-1 through 320-4, may be specified. However, the number of the components is specified by way for example for concrete and clear descriptions, and it should be understood that there is no intention to limit the technical scope of the invention.

The O-rings 351 are provided between the lower end of the outer tube 360 and the top opening of the manifold 350 and between the throat lid 344 and the bottom opening of the manifold 350, and a space between the outer tube 360 and the manifold 350 is sealed hermetically.

An inert gas or a process gas is introduced inside the outer tube 360 via the gas introducing nozzle 340 located below the outer tube 360.

The exhaust tube 346 (FIG. 2) coupled to the PS 378, the APC 380, and the EP 382 is attached to the top portion of the manifold 350.

A process gas flowing through a space between the outer tube 360 and the inner tube 362 is discharged to the outside via the exhaust tube 346, the APC 380, and the EP 382.

The APC 380 regulates the interior of the outer tube 360 to be at a desired pressure set in advance according to an instruction of the pressure control portion 416 under the control on the basis of the pressure measurement value inside the outer tube 360 from the PS 378.

More specifically, when an inert gas needs to be introduced to maintain the interior of the outer tube 360 at normal pressure, the APC 380 regulates the pressure according to an instruction from the pressure control portion 416 so as to maintain the interior of the outer tube 360 at normal pressure. When a process gas used to process the wafers 12 needs to be introduced while maintaining the interior of the outer tube 360 at a low pressure, the APC 380 regulates the pressure so as to maintain the interior of the outer tube 360 at a desired low pressure according to an instruction of the pressure control portion 416.

The boat 14 holding a large number of semiconductor substrates (wafers) 12 is coupled to the rotation shaft 348 at the bottom of the boat 14.

Further, the rotation shaft 348 is coupled to the boat elevator 108 (FIG. 1), and the boat elevator 108 lifts up and down the boat 14 at a pre-determined speed under the control via the EC 376.

Also, the boat elevator 108 rotates the wafers 12 and the boat 14 at a pre-determined speed via the rotation shaft 348.

The wafers 12 to be processed are transported in a state where they are loaded in a wafer cassette 490 (FIG. 1) and delivered onto the cassette exchanging unit 100.

The cassette exchanging unit 100 transfers the wafers 12 to the cassette stocker 102 or the buffer cassette stocker 104.

The wafer moving machine 106 takes out the wafers 12 from the cassette stocker 102 and loads them in the boat 14 in multiple stages in a horizontal posture.

The boat elevator 108 lifts up the boat 14 in which the wafers 12 are loaded and introduces it inside the process chamber 3.

Also, the boat elevator 108 lifts down the boat 14 in which the processed wafers 12 are loaded and takes it out from the process chamber 3.

Temperature and Film Thickness of Wafer 12

Figure 5:
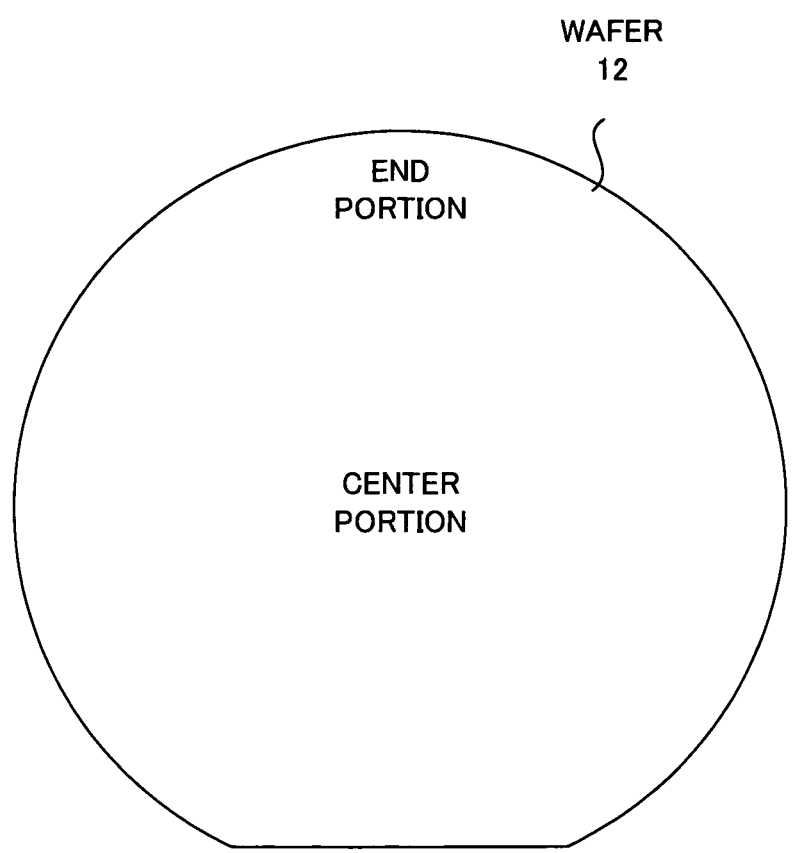
FIG. 5 is a view showing an example of the shape of a wafer to be processed by the semiconductor processing apparatus.

FIG. 5 is a view showing an example of the shape of the wafer 12 that will be processed by the semiconductor processing apparatus 1 (FIG. 1).

The plane of the wafer 12 (hereinafter, the plane of the wafer 12 is also referred to simply as the wafer 12) is of a shape as shown in FIG. 5 and held in the boat 14 in a horizontal posture.

Also, the wafer 12 is heated from the periphery of the outer tube 360 by light emitted from the temperature regulation parts 320-1 through 320-4 and passing through the outer tube 360.

Accordingly, the wafer 12 absorbs a large amount of light at the end portion and in a case where the cooling gas is not flown through the cooling gas channel 352, the temperature at the end portion on the surface of the wafer 12 becomes higher than the temperature at the center portion.

In other words, the temperature regulation parts 320-1 through 320-4 give rise to a bowl-shaped temperature deviation on the wafer 12 from the end portion to the center portion of the wafer 12, that is, a temperature deviation that the temperature becomes higher at a point closer to the outer periphery of the wafer 12 and the temperature becomes lower at a point closer to the center portion.

In addition, because a process gas, such as a reaction gas, is supplied also from the outer periphery side of the wafer 12, a reaction speed may vary between the end portion and the center portion of the wafer 12 depending on the kinds of film to be deposited on the wafer 12.

For example, a process gas, such as a reaction gas, is consumed at the end portion of the wafer 12, after which it reaches the center portion of the wafer 12. Accordingly, the concentration of the process gas becomes lower at the center portion of the wafer 12 than at the end portion of the wafer 12.

Hence, even in a case where there is no temperature deviation between the end portion and the center portion of the wafer 12, the thickness of a film deposited on the wafer 12 may possible become uneven between the end portion and the center portion due to a supply of the reaction gas from the outer periphery side of the wafer 12.

Meanwhile, when the cooling gas passes through the cooling gas channel 352, as has been described above, the outer tube 360 and the wafers 12 set in the boat 14 are cooled from the circumferential direction (the outer periphery side).

More specifically, the process chamber 3 becomes able to set different temperatures for the center portion and the end portion of the wafer 12 by heating the wafer 12 for the temperature at the center portion to reach the specific preset temperature (process temperature) using the temperature regulation parts 320 and by cooling the outer periphery side of the wafer 12 using the cooling gas forced to pass through the cooling gas channel 352.

As has been described, in order to deposit a uniform film on the wafer 12, it is necessary to perform heating control (control including heating and cooling and the like) to regulate the film thickness in response to a reaction speed at which the film is deposited on the wafer 12 or the like.

Figure 6:
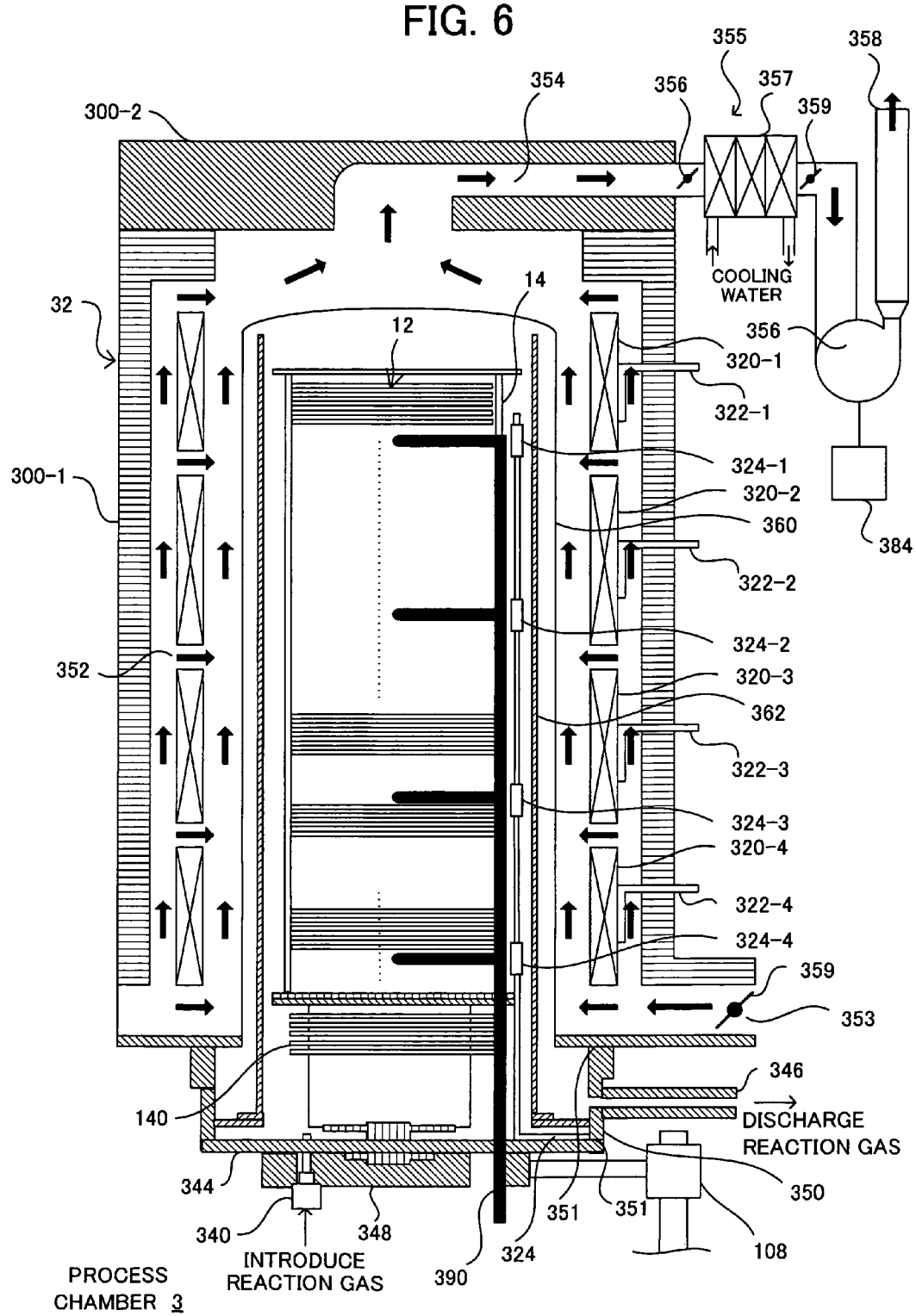
FIG. 6 is a view showing a state where an L-type temperature sensor (L-type TC) is provided to the process chamber accommodating the boat and the wafers by way of example.

FIG. 6 is a view showing a state where an L-type temperature sensor (L-type TC) 390 is provided to the process chamber 3 accommodating the boat 14 and the wafers 12 by way of example.

The control portion 2 may be configured so as to control the temperature regulation parts 320 and a flow rate of the cooling gas passing through the cooling gas channel 352 by calculating, for example, the end portion temperature and the center portion temperature of the wafer 12 (the temperatures with respect to the substrate in-plane positions) using the temperature measurement values of the inside temperature sensors 324.

The inside temperature sensors 324 are provided between the boat 14 and the inner tube 362.

The inside temperature sensors 324, however, may be provided between the inner tube 362 and the outer tube 360.

In a case where the temperatures at the end portion and the center portion of the wafer 12 are calculated using the temperature measurement values of the inside temperature sensors 324, for example, it is necessary to correct a variance of the temperature measurement values of the inside temperature sensors 324 caused by the cooling gas passing through the cooling gas channel 352 with the use of the actual end portion temperature and center portion temperature of the wafer 12 and a variance of the temperature measurement values of the inside temperature sensors 324 caused by the cooling gas passing through the cooling gas channel 352.

The L-type temperature sensor 390 is, for example, a thermocouple shaped like a capital L at more than one point in order to measure the temperatures in the vicinity of the center portions of the wafers 12 at levels almost as high as the respective inner temperature sensors 324, and it outputs the temperature measurement values to the control portion 2.

Also, the L-type temperature sensor 390 measures the temperatures in the vicinity of the center portions of the wafers 12 at more than one point before the semiconductor processing apparatus 1 starts to process the wafers 12, and it is removed while the semiconductor processing apparatus 1 is processing the wafers 12.

It should be noted that the L-type temperature sensor 390 is hermetically sealed to the throat lid 344 via a joint.

It is configured in such a manner so as to control the temperature by assuming that the temperatures detected by the L-type temperature sensor 390 are the temperatures at the center portions of the wafers 12 and the temperatures detected by the inside temperature sensors 324 are the temperatures at the end portions of the wafers 12.

Also, it is configured in such a manner so as to control the temperature by assuming that a difference between the temperatures detected by the L-type temperature sensor 390 and the temperatures detected by the inside temperature sensors 324 is a wafer in-plane temperature deviation.

Figure 7:
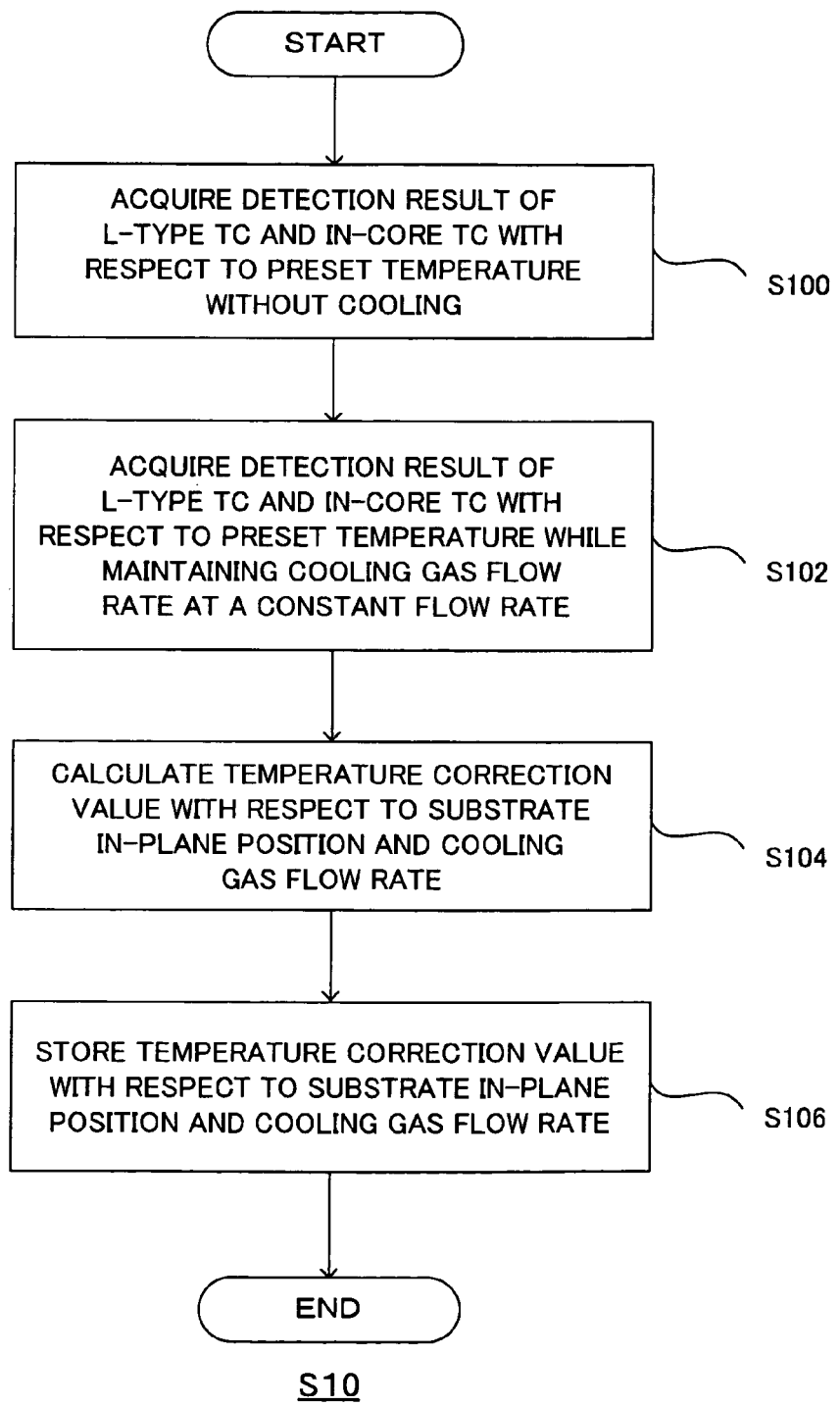
FIG. 7 is a flowchart detailing a method of correcting a temperature measurement value of an inside temperature sensor that varies with a cooling gas passing through a cooling gas channel at each substrate in-plane position.

FIG. 7 is a flowchart (S10) detailing a method of correcting the temperature measurement values of the inside temperature sensors 324 that vary with the cooling gas passing through the cooling gas channel 352 at each substrate in-plane position.

As is shown in FIG. 7, in Step 100 (S100), the control portion 2 controls the temperature in such a manner that the temperatures detected by the L-type temperature sensor 390 coincide with the specific preset temperature (process temperature) without performing the cooling using the cooling gas.

The control portion 2 then acquires the detection result of the inside temperature sensors (in-core TCs) 324 with respect to the specific preset temperature (process temperature) when the temperatures detected by the L-type temperature sensor 390 coincide with the specific preset temperature (process temperature).

In Step 102 (S102), the control portion 2 controls the temperature in such a manner that the temperatures detected by the L-type temperature sensor 390 coincide with the specific preset temperature (process temperature) while maintaining the cooling gas flow rate passing through the cooling gas channel 352 (that is, a flow rate of the cooling gas exhausted by the cooling exhaust device 356) at a constant flow rate.

The control portion 2 then acquires the detection result of the inside temperature sensors (in-core TCs) 324 with respect to the specific preset temperature (process temperature) when the temperatures detected by the L-type temperature sensor 390 coincide with the specific preset temperature (process temperature).

Further, the control portion 2 varies the cooling gas flow rate passing through the cooling gas channel 352 and controls the temperature in such a manner that the temperatures detected by the L-type temperature sensor 390 coincide with the specific preset temperature (process temperature) while maintaining the flow rate at a constant flow rate that is the varied flow rate.

The control portion 2 then acquires the detection result of the inside temperature sensors (in-core TCs) 324 with respect to the specific preset temperature (process temperature) when the temperatures detected by the L-type temperature sensor 390 coincide with the specific preset temperature (process temperature).

The control portion 2 repetitively performs Step 202 (S202) a pre-determined number of times so that the relation among the cooling gas flow rate passing through the cooling gas channel 352, the specific preset temperature (the temperatures detected by the L-type temperature sensor 390), and the temperatures detected by the inside temperature sensors 324 becomes obvious.

In Step 104 (S104), the control portion 2 calculates temperature correction values (values corresponding to variances of the temperature measurement values caused by the cooling gas) of the respective inside temperature sensors 324 with respect to the cooling gas flow rate at the specific preset temperature (temperatures detected by the L-type temperature sensor 390).

In Step 106 (S106), the control portion 2 stores the respective temperature correction values calculated by the processing in S204, for example, into a temperature preset value storage portion 424 in correlation with the cooling gas flow rate as additional information representing the correlation at the specific preset temperature (process temperature).

The control portion 2 then removes the L-type temperature sensor 390 when processing the wafers 12, and corrects the temperature measurement values in the inside temperature sensors 324 using the temperature correction values stored by the processing in S106. The control potion 2 then sets the cooling gas flow rate passing through the cooling gas channel 352 (that is, the flow rate of the cooling gas exhausted by the cooling gas exhaust device 356) corresponding to the temperature correction values, and controls the temperatures of the temperature regulation parts 320 so that the corrected temperature measurement values of the inside temperature sensors 324 coincide with a desired preset temperature (process temperature).

The L-type temperature sensor 390 was described as a thermocouple shaped like a capital L at more than one point to be capable of measuring the temperature in the vicinity of the center portion of the wafer 12 at more than one point. However, it may be a thermocouple shaped like a capital L at one point to be capable of measuring the temperature in the vicinity of the center portion of the wafer 12 at one point to find the relation of the temperature correction values of the inside temperature sensors 324 and the cooling gas flow rate.

In addition, the number of the L-type temperature sensor 390 to be provided may be different from the number of the inside temperature sensors 324.

Further, a temperature sensor of a type in which a thermocouple is embedded at a point corresponding to the wafer center portion may be used instead of the L-type temperature sensor 390.

Summary of Low-Pressure CVD Processing by Semiconductor Processing Apparatus 1

The semiconductor processing apparatus 1 deposits a film, such as an $Si_3N_4$ film, an $SiO_2$ film, and a poly-silicon (poly-Si) film, on the semiconductor wafers 12 aligned at pre-determined intervals in the process chamber 3 by means of CVD under the control of the control program 40 (FIG. 3) run on the control portion 2 (FIG. 1 and FIG. 4).

Film deposition using the process chamber 3 will be described further.

Initially, the boat elevator 108 lifts down the boat 14.

A desired number of wafers 12 to be processed are then set in the boat 14 that has moved down and the boat 14 holds the wafers 12 set therein.

Subsequently, each of the four temperature regulation parts 320-1 through 320-4 of the heater 32 heats the interior of the outer tube 360 according to the settings so as to heat the center portion of each wafer 12 to reach the preset constant temperature.

Meanwhile, the cooling gas is flown through the cooling gas channel 352 according to the settings, and the outer tube 360 and the wafers 12 set in the boat 14 are cooled from the circumferential direction (the outer periphery side).

Subsequently, the MFC 374 regulates the flow rate of the gas to be introduced via the gas introducing nozzle 340 (FIG. 2) and introduces an inert gas inside the outer tube 360 and fills the latter with the former.

The boat elevator 108 lifts up the boat 14 and moves it inside the outer tube 360 in a state where it is filled with the inert gas at a desired process temperature.

Subsequently, the inert gas inside the outer tube 360 is exhausted by the EP 382 so as to evacuate the interior of outer tube 360, and the boat 14 and the wafers 12 held therein are rotated via the rotation shaft 348.

As the process gas is introduced inside the outer tube 360 via the gas introducing nozzle 340 in this state, the introduced process gas goes up inside the outer tube 360 and is thereby supplied evenly to the wafers 12.

The EP 382 exhausts the process gas from the inside of the outer tube 360 during the low-pressure CVD processing via the exhaust tube 346, and the APC 380 controls the process gas inside the outer tube 360 to be at a desired pressure.

As has been described, the low-pressure CVD processing is applied to the wafers 12 for a pre-determined time.

When the low-pressure CVD processing ends, the process gas in the interior of the outer tube 360 is replaced by an inert gas and the pressure thereof is regulated to be normal pressure in order to proceed to the following processing on the wafers 12.

Further, the cooling gas is flown through the cooling gas channel 352 to cool the interior of the outer tube 360 to the pre-determined temperature.

In this state, the boat 14 and the processed wafers 12 held therein are lifted down by the boat elevator 108 and taken out from the outer tube 360.

The boat elevator 108 lifts up the boat 14 holding therein the wafers 12 to be processed next by the low-pressure CVD processing and set it inside the outer tube 360.

The following low-pressure CVD processing is then applied to the wafers 12 set in this manner.

It is possible to control the film thickness by flowing the cooling gas since before the start of the processing till the end of the processing on the wafers 12. It is, however, preferable to also flow the cooling gas while the boat 14 in which are set the wafers 12 is moved inside the outer tube 360 and while the boat 14 is taken out from the outer tube 360.

Accordingly, not only is it possible to prevent the temperature from varying due to heat retained in the process chamber 3 because of the heat capacity of the process chamber 3, but it is also possible to enhance the throughput.

Example of Control of Film Thickness Uniformity

Figure 8A:
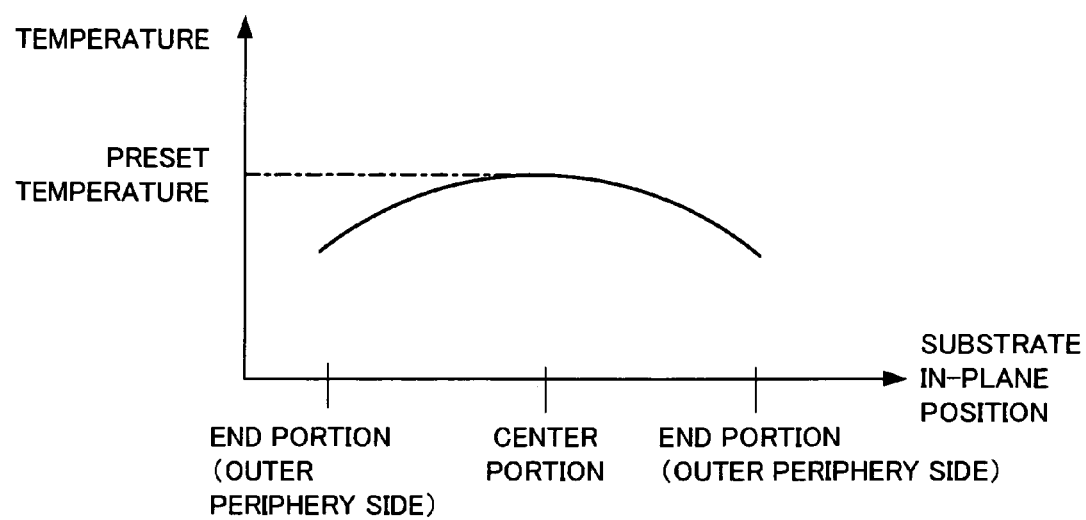
FIG. 8A is a graph showing an example of the preset temperature with respect to substrate in-plane positions and FIG. 8B is a graph showing the film thickness deposited in response to the preset temperature shown in FIG. 8A.
Figure 8B:
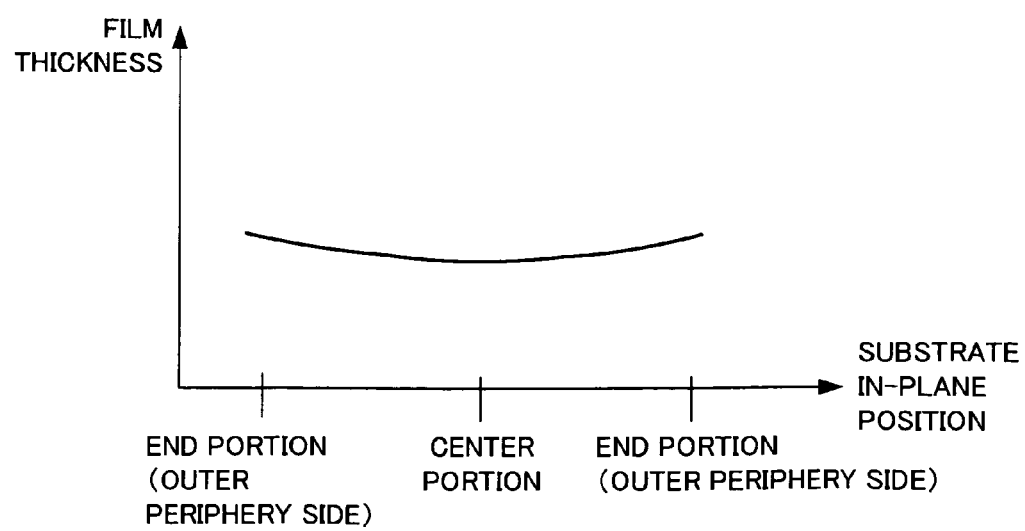

FIG. 8 shows graphs representing examples of a relation between the temperature and the film thickness in a case where a film is deposited on the substrate, such as the wafer 12, by the semiconductor processing apparatus 1. FIG. 8A is a graph showing an example of the preset temperature with respect to the substrate in-plane positions and FIG. 8B is a graph showing the film thickness deposited depending on the preset temperature shown in FIG. 8A.

Figure 9A:
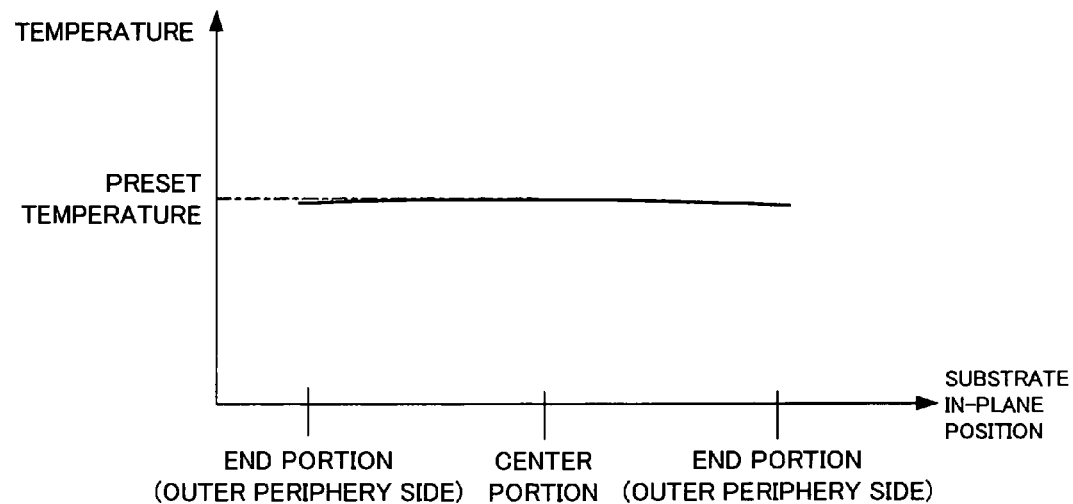
FIG. 9A is a graph showing a comparative example of the preset temperature with respect to substrate in-plane positions and FIG. 9B is a graph showing the film thickness deposited in response to the preset temperature shown in FIG. 9A.
Figure 9B:
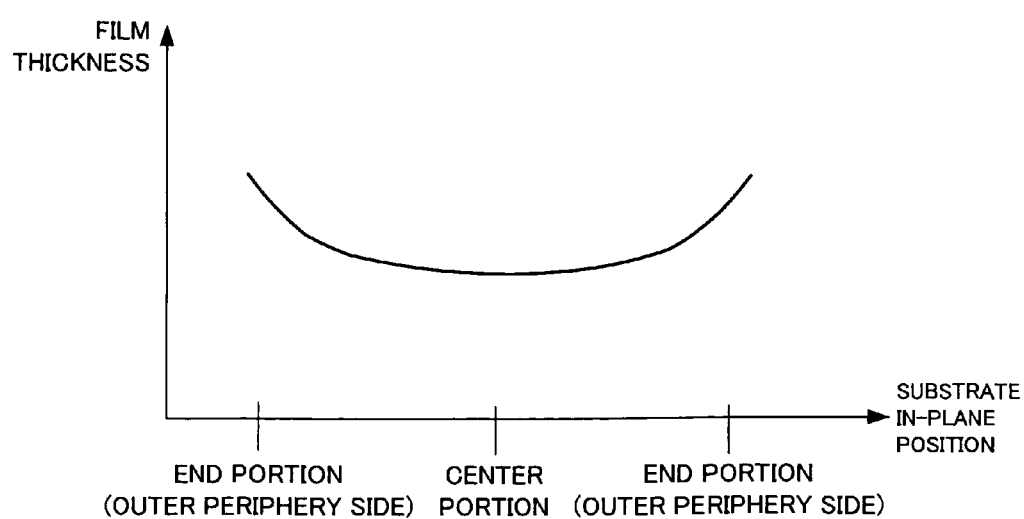

FIG. 9 shows graphs representing comparative examples of a relation between the temperature and the film thickness in a case where a film is deposited on the substrate, such as the wafer 12, by the semiconductor processing apparatus 1. FIG. 9A is a graph showing a comparative example of the preset temperature with respect to the substrate in-plane positions and FIG. 9B is a graph showing the film thickness deposited depending on the preset temperature shown in FIG. 9A.

As is shown in FIG. 8A, when the control portion 2 controls the temperatures of the temperature regulation parts 320 and the cooling gas flow rate passing through the cooling gas channel 352 in such a manner that the center portion of the substrate reaches the specific preset temperature (process temperature) and the end portion of the substrate has a temperature lower than the process temperature, as is shown in FIG. 8B, the film thickness deposited on the substrate becomes almost uniform at the center portion and the end portion of the substrate.

For example, when the cooling gas is flown to lower the temperature of the outer tube 360 in comparison with the substrate temperature, the temperature at the end portion of the substrate drops below the temperature at the center portion of the substrate.

On the contrary, as is shown in FIG. 9A, when the control portion 2 controls the temperatures of the temperature regulation parts 320 (for example, so as not to flow the cooling gas through the cooling gas channel 352) in such a manner that the center portion and the end portion of the substrate achieve the specific preset temperature (process temperature), as is shown in FIG. 9B, the thickness of the film deposited on the end portion of the substrate becomes larger than the thickness of the film deposited on the center portion of the substrate.

For example, when the cooling gas is flown in such a manner that the substrate temperature and the temperature of the outer tube 360 become equal, the temperature at the center portion of the substrate and the temperature at the end portion of the substrate become equal.

To be more concrete, one condition is chosen, for example, from plural items of data in the temperature preset value storage portion 424, in which temperature correction values of the inside temperature sensors 324 at the specific preset temperature (process temperature) shown in FIG. 6 and found in advance are stored in correlation with the cooling gas flow rate. Then, the control portion 2 controls the cooling gas exhaust device 356 via the cooling gas flow rate control portion 422 and the inverter 384 while controlling the temperature regulation parts 320 of the heater 32 via the temperature control portion 410 under the condition thus chosen.

More specifically, the temperature correction values are set to the measurement temperatures of the inside temperature sensors 324 and the cooling gas flow rate corresponding to the temperature correction values is set. Then, the flow rate of the cooling gas exhausted by the cooling gas exhaust device 356 is controlled in response to the cooling gas flow rate thus set while the temperature regulation parts 320 of the heater 32 are heated under the control according to the corrected measurement temperatures of the inside temperature sensors 324.

In this controlled state, the processing to deposit a film of the pre-determined film thickness on the wafers 12 is performed by introducing the process gas inside the outer tube 360 via the gas introducing nozzle 340 while rotating the boat 14 and the wafers 12 held therein inside the outer tube 360.

Thereafter, the processed wafers 12 are taken out from the outer tube 360. After the wafers 12 are taken out, the film thickness of each processed wafer 12 is measured to confirm whether the film thickness within the plane of the substrate (within the plane of the wafer 12) is uniform.

When the thickness of the film deposited on the end portion of the substrate is larger than the thickness of the film deposited on the center portion of the substrate within the plane of the substrate, a cooling gas flow rate corresponding to a value larger than the temperature correction values under the one condition chosen earlier is chosen among the data, for example, in the temperature preset value storage portion 424 that stores the temperature correction values of the inside temperature sensors 324 at the specific preset temperature (process temperature) shown in FIG. 6 described above and found in advance in correlation with the cooling gas flow rate. Then, the processing to deposit a film of the pre-determined film thickness on the wafers 12 is performed again under the newly chosen condition.

Meanwhile, when the thickness of the film deposited on the end portion of the substrate is smaller than the thickness of the film deposited on the center portion of the substrate within the plane of the substrate, a cooling gas flow rate corresponding to a value smaller than the temperature correction values under the one condition chosen earlier is chosen among the data, for example, in the temperature preset value storage portion 424 that stores the temperature correction values of the inside temperature sensors 324 at the specific preset temperature (process temperature) shown in FIG. 6 described above and found in advance in correlation with the cooling gas flow rate. Then, the processing to deposit a film of the pre-determined film thickness on the wafers 12 is performed again under the newly chosen condition.

The film thickness is fine-tuned by actually performing film deposition on the wafer 12 until the film thickness within the substrate plane becomes uniform at a desired film thickness.

Also, in this instance, the heating is controlled using the values obtained by adding the temperature correction values to the inside temperature sensors 324-1 through 324-4 respectively corresponding to the temperature regulation parts 320-1 through 320-4 and the cooling gas flow rate corresponding to the temperature correction values, so that not only the uniformity of the substrate in-plane film thickness, but also the uniformity of the film thickness between substrates (the film thicknesses among plural wafers held in the boat 14) can be fine-tuned.

In a case where there is no desired condition among the data, for example, in the temperature preset value storage portion 424 storing the temperature correction values of the inside temperature sensors 324 at the specific preset temperature (process temperature) shown in FIG. 6 and found in advance in correlation with the cooling gas flow rates, fine-tuning may be performed until the film thickness becomes uniform at the pre-determined film thickness under the condition where the temperature correction values of the inside temperature sensors 324 and the cooling gas flow rate are directly changed with reference to the data.

In this instance, fine-tuning may be performed until the film thickness becomes uniform at the pre-determined film thickness under the condition where the temperature correction values of the inside temperature sensors 324 and the cooling gas flow rate are directly changed, so that the temperatures detected by the L-type temperature sensor 390 reach the specific preset temperature (process temperature) without rotating the boat 14 and the wafers 12 held therein while the L-type temperature sensor 390 is hermetically sealed to the throat lid 344 via a joint.

When the fine-tuning is completed, the temperature correction values of the inside temperature sensors 324 and the cooling gas flow rate are set to the found values at which the film thickness uniformity becomes satisfactory. Then, the cooling gas exhaust device 356 controls the flow rate of the cooling gas corresponding to the cooling gas flow rate thus set while the temperature regulation parts 320 of the heater 32 are heated under the control according to the corrected measurement temperatures of the inside temperature sensors 324.

In this controlled state, the processing is performed to deposit a film at the pre-determined film thickness on the wafers 12 by introducing the process gas inside the outer tube 360 via the gas introducing nozzle 340 while rotating the boat 14 and the wafers 12 held therein inside the outer tube 360.

As has been described, by controlling the center portion temperature of the wafer 12 to be maintained at a constant temperature that is the preset temperature using the heater 32, and at the same time by controlling the temperatures to provide a temperature difference between the end portion (peripheral) temperature and the center portion temperature of the wafer 12 using the cooling gas, it is possible to enhance the in-plane film thickness uniformity of the wafer 12, and hence the film thickness uniformity between the planes without changing the film quality.

For example, in a case where a CVD film, such as an $Si_3N_4$, is deposited, the refraction index of the film may vary with the process temperature when the film is deposited while the process temperature is varied, or a film having a low etching rate changes to a film having a high etching rate in response to the process temperature when film deposition processing is carried out while the process temperature is lowered from a high temperature to a low temperature.

Also, in the case of film deposition of an $Si_3N_4$ film, when the film is deposited while the process temperature is lowered from a high temperature to a low temperature, a film having a high stress value changes to a film having a low stress value in response to the process temperature.

In view of the foregoing, the semiconductor process apparatus 1 controls the in-plane temperature of the substrate, such as the wafer 12, by controlling the temperature of the outer tube 360, which is achieved by controlling the temperatures of the temperature regulation parts 320 and the cooling gas flow rate passing through the cooling gas channel 352 by means of the control portion 2. Hence, the semiconductor processing apparatus 1 has an excellent advantage that it is capable of controlling the uniformity of the thickness of a film deposited on the substrate while preventing the film quality from being changed.

First Modification of Process Chamber 3

Modifications of the process chamber 3 will now be described.

FIG. 10 is a view showing a first modification of the process chamber 3.

In the first modification of the process chamber 3, components substantially the same as those of the process chamber 3 shown in FIG. 2 are labeled with the same reference numerals.

As is shown in FIG. 10, in the first modification of the process chamber 3, the exhaust channel 354 is provided with cooling gas exhaust devices 392 and 393, such as blowers having different exhaust amounts (total flow rates), via shutters 394 and 395, respectively.

The number of revolutions is controlled by the control portion 2 separately for the cooling gas exhaust devices 392 and 393 via inverters 396-1 and 369-2, respectively.

Also, the first modification of the process chamber 3 is configured in such a manner that a flow rate of the cooling gas passing through the cooling gas channel 352 is controlled finely by controlling the inverters 396-1 and 396-2 and the shutters 394 and 395 separately by means of the control portion 2.

Further, the first modification of the process chamber 3 may be configured in such a manner that the flow rate of the cooling gas is controlled by reducing the conductance from the exhaust channel 354 to the cooling gas exhaust devices 392 and 393 or by providing a dumper 397.

Hence, because the first modification of the process chamber 3 can control the flow rate of the cooling gas passing through the cooling gas channel 352 finely, it is possible to control the cooling of the outer tube 360 and the wafers 12 on the outer periphery side, which makes it possible to control the uniformity of the thickness of a film deposited on the wafer 12.

Second Modification of Process Chamber 3

Figure 11:
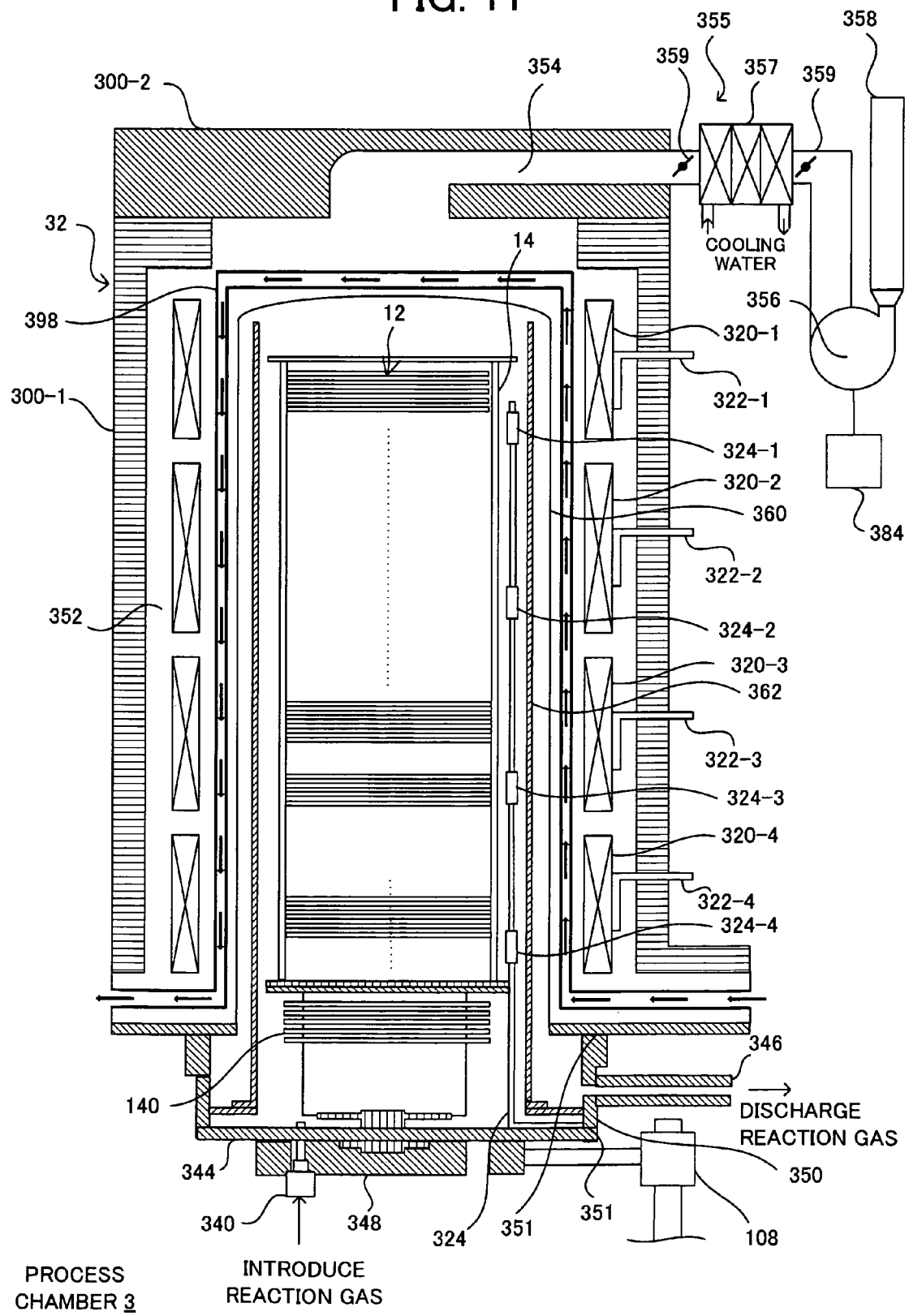
FIG. 11 is a view showing a second modification of the process chamber.

FIG. 11 is a view showing a second modification of the process chamber 3.

In the second modification of the process chamber 3, components substantially the same as those of the process chamber 3 shown in FIG. 2 are labeled with the same reference numerals.

As is shown in FIG. 11, the second modification of the process chamber 3 has a tube 398 between the outer tube 360 and the temperature regulation parts 320.

The tube 398 is configured in such a manner that the cooling gas is flown therein, for example, by an unillustrated blower (exhaust device).

In other words, the second modification of the process chamber 3 cools the outer periphery side of the outer tube 360 and the wafers 12 by flowing the cooling gas through the tube 398, and thereby controls the uniformity of the thickness of a film deposited on the wafer 12.

The second modification of the process chamber 3 may be configured so as to control the cooling gas flow rates passing through the tube 398 and the cooling gas channel 352 separately, or it may be configured in such a manner so as to control the uniformity of the thickness of a film deposited on the wafer 12 with the cooling gas flow rate passing through the tube 398.

Third Modification of Process Chamber 3

FIG. 12 is a view showing a third modification of the process chamber 3.

In the third modification of the process chamber 3, components substantially the same as those of the process chamber 3 shown in FIG. 2 are labeled with the same reference numerals.

As is shown in FIG. 12, in the third modification of the process chamber 3, the outer tube 360 is of a hollow structure and a cooling gas channel 399 is formed in the outer tube 360.

The cooling gas channel 399 is configured in such a manner that the cooling gas is flown therein, for example, by an unillustrated blower (exhaust device).

In other words, the third modification of the process chamber 3 cools the outer periphery side of the wafers 12 by flowing the cooling gas through the cooling gas channel 399, and thereby controls the uniformity of the thickness of a film deposited on the wafer 12.

It should be appreciated that the invention is not limited to the embodiments above, and it goes without saying that the various modifications are possible without deviating from the scope of the invention. For example, the semiconductor processing apparatus 1 may be configured to control the cooling gas flow rate using an air intake device or under the mass flow control.

In addition, the heating device can be of any optically heating type. For example, it may adopt a resistance heating method or a lamp heating method.

Further, the semiconductor processing apparatus 1 may be configured in such a manner so as to cool the outer periphery side of the outer tube 360 and the wafers 12 by flowing a fluid, for example, water, instead of the cooling gas.

As has been described, the invention includes the features in the appended claims. It should be appreciated, however, that the invention further includes the following embodiments.

(1) The cooling device has a cooling gas channel provided on the outer periphery side of the process chamber to flow a cooling gas therein, an exhaust channel to introduce therein the cooling gas flown in the cooling gas channel so as to be exhausted, and an exhaust portion provided to the exhaust channel to exhaust the cooling gas.

(2) The exhaust portion has plural exhaust devices having different exhaust amounts, and the heating control portion controls the plural exhaust devices separately.

(3) A substrate processing method of the invention has: optically heating a substrate accommodated in a process chamber from an outer periphery side of the substrate by a heating device; cooling the outer periphery side of the substrate by a cooling device that flows a fluid in a vicinity of an outer periphery of the substrate; detecting a temperature inside the process chamber; and controlling the heating device and the cooling device separately according to the detected temperature.

(4) Another substrate processing method of the invention has: optically heating a substrate accommodated in a process chamber from an outer periphery side of the substrate by a heating device; cooling the outer periphery side of the substrate by flowing a cooling gas in a vicinity of an outer periphery of the substrate; exhausting the cooling gas by plural exhaust devices having different exhaust amounts; detecting a temperature inside the process chamber; and controlling the heating device and the plural exhaust devices according to the detected temperature.

(5) The substrate processing apparatus according to any one of claims 1 through 3 is configured in such a manner that the heating device optically heats the substrate so that the center portion of the substrate reaches a pre-set temperature that is a constant temperature.

(6) The substrate processing apparatus set forth in (5) further has: a temperature acquiring portion that acquires temperatures at the center portion and the outer periphery side of the substrate; a correlation acquiring portion that acquires a correlation of a preset temperature and a flow rate of the fluid with a temperature deviation between the center portion and the outer periphery side of the substrate in a case where an amount of the fluid flown by the cooling device is varied while the heating device is heating the substrate; and a preset temperature correction portion that corrects the preset temperature of the heating portion according to the correlation acquired by the correlation acquiring portion.

(7) The substrate processing apparatus set forth in (6) is configured in such a manner that in a case where an amount of the fluid flown by the cooling device is varied while the heating device is heating the substrate, the correlation acquiring portion further acquires a correlation of the preset temperature and the flow rate of the fluid with the temperature detected by the temperature detection portion, and the preset temperature correction portion corrects the preset temperature of the heating device according to the correlation acquired by the correlation acquiring portion.

(8) The substrate processing method according to claim 4 or 5 is configured in such a manner that the heating device optically heats the substrate so that the center portion of the substrate reaches a pre-set temperature that is a constant temperature.

(9) Still another substrate processing method has: accommodating a substrate in a process chamber; optically heating the substrate accommodated in the process chamber from an outer periphery side of the substrate by a heating device; cooling the outer periphery side of the substrate by a cooling device that flows a fluid in a vicinity of an outer periphery of the substrate; detecting a temperature inside the process chamber; controlling the heating device and the cooling device according to the detected temperature; and carrying the substrate out from the process chamber.

Industrial Applicability

As has been described, the invention can be used to a substrate processing method and film forming method that controls the uniformity of the thickness of a film deposited on the substrate.

The invention claimed is:

1. A substrate processing method in a processing chamber, comprising:

accommodating a substrate into a processing chamber; and processing the substrate in the processing chamber on the basis of
a correlation of a preset temperature of a heating device,
a flow rate of fluid supplied by a cooling device, and
a temperature deviation between a center portion of the substrate accommodated in the processing chamber and an outer peripheral side of the substrate,
wherein temperature is measured using an L-type temperature sensor.

2. The substrate processing method according to claim 1, wherein the correlation is acquired on a basis of a relationship of the preset temperature and the flow rate with the temperature deviation when an amount of the fluid supplied by the cooling device is varied while the heating device is heating the substrate.

3. The substrate processing method according to claim 1, wherein the correlation is acquired on a basis of a relationship of the preset temperature and the flow rate of the fluid with the temperature deviation between the center portion of the substrate and the outer peripheral side of the substrate.

4. The substrate processing method according to claim 1, further comprising:
introducing a process gas, wherein the preset temperature of the heating device is kept to the same temperature at least in the process gas introducing step.

5. The substrate processing method according to claim 1, wherein the preset temperature of the heating device is corrected in advance before the substrate accommodating step.

6. The substrate processing method according to claim 4, wherein the process gas introducing step is executed with a temperature at the center portion of the substrate being kept to a predetermined temperature while a temperature at the outer peripheral side of the substrate is lower than the temperature at the center portion of the substrate.

7. A film forming method for forming a film on a substrate in a processing chamber comprising:
accommodating a substrate into a processing chamber; and
introducing a process gas into the processing chamber and forming a film on the substrate on the basis of
a correlation of a preset temperature of a heating device,
a flow rate of fluid supplied by a cooling device, and
a temperature deviation between a center portion of the substrate accommodated in the processing chamber and an outer peripheral side of the substrate,
wherein temperature is measured using an L-type temperature sensor.

8. The film forming method according to claim 7, wherein the correlation is acquired on a basis of a relationship of the preset temperature and the flow rate with the temperature deviation when an amount of the fluid supplied by the cooling device is varied while the heating device is heating the substrate.

9. The film forming method according to claim 7, wherein the correlation is acquired on a basis of a relationship of the preset temperature and the flow rate of the fluid with the temperature deviation between the center portion of the substrate and the outer peripheral side of the substrate.

10. The film forming method according to claim 7, wherein in the film forming step, the preset temperature of the heating device is kept to the same temperature while at least the process gas is introduced to form the film on the substrate.

11. The film forming method according to claim 7, wherein the film forming step is executed with a temperature at the center portion of the substrate being kept to a predetermined temperature under a state that a temperature at the outer peripheral side of the substrate is lower than the temperature at the center portion of the substrate while at least the process gas is introduced to form the film on the substrate.

12. The film forming method according to claim 7, wherein the preset temperature of the heating device is corrected in advance before the accommodating step.

13. A film forming method for forming a film on a substrate in a processing chamber comprising:
introducing a process gas into the processing chamber to form the film on the substrate under a state that a heating device optically heats the substrate accommodated in the processing chamber from an outer peripheral side of the substrate at a preset temperature kept to the same temperature and a cooling device supplies fluid to the outside of the processing chamber to cool the outer peripheral side of the substrate while a temperature at a center portion of the substrate is maintained to be a predetermined temperature,
wherein temperature is measured using an L-type temperature sensor.

14. The film forming method according to claim 13, wherein the preset temperature and a supply amount of the fluid of the cooling device are set in advance on the basis of a correlation of the predetermined temperature of the heating device, a flow rate of the fluid, and a temperature deviation between the center portion of the substrate and the outer peripheral side of the substrate.

15. The film forming method according to claim 14, wherein the preset temperature of the heating device is corrected in advance on a basis of the correlation of the preset temperature, the flow rate, and the temperature deviation between the temperature at the center portion of the substrate accommodated in the processing chamber and the temperature at the outer peripheral side of the substrate.

16. A non-transitory computer-readable medium storing a control program which, when executed by a hardware processor, causes a computer to function as a device comprising:
means for accommodating a substrate into a processing chamber; and
means for processing the substrate in the processing chamber on the basis of
a correlation of a preset temperature of a heating device,
a flow rate of fluid supplied by a cooling device, and
a temperature deviation between a center portion of the substrate accommodated in the processing chamber and an outer peripheral side of the substrate,
wherein temperature is measured using an L-type temperature sensor.

* * * * *